United States Patent
Shimomura et al.

(10) Patent No.: US 11,757,546 B2
(45) Date of Patent: Sep. 12, 2023

(54) COMMUNICATION DEVICE RECEPTION SENSITIVITY MEASUREMENT METHOD AND COMMUNICATION DEVICE NOISE CONTROL EFFECT EVALUATION METHOD USING THE SAME

(71) Applicant: Murata Manufacturing Co., Ltd., Kyoto-fu (JP)

(72) Inventors: Akiko Shimomura, Nagaokakyo (JP); Kenichi Ito, Nagaokakyo (JP); Yu Ishiwata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 217 days.

(21) Appl. No.: 17/411,996

(22) Filed: Aug. 25, 2021

(65) Prior Publication Data
US 2021/0384996 A1 Dec. 9, 2021

Related U.S. Application Data

(63) Continuation of application No. PCT/JP2020/002465, filed on Jan. 24, 2020.

(30) Foreign Application Priority Data

Feb. 28, 2019 (JP) .................................. 2019-035308

(51) Int. Cl.
*H04B 17/345* (2015.01)
*H04B 17/10* (2015.01)
(Continued)

(52) U.S. Cl.
CPC ....... *H04B 17/345* (2015.01); *G01R 29/0821* (2013.01); *H04B 17/102* (2015.01); *H04B 17/15* (2015.01)

(58) Field of Classification Search
CPC .... H04B 17/345; H04B 17/102; H04B 17/15; G01R 29/0821
See application file for complete search history.

(56) References Cited

U.S. PATENT DOCUMENTS

2019/0004102 A1* 1/2019 Gienger ............... H01Q 3/2676

FOREIGN PATENT DOCUMENTS

| JP | 2005-518172 A | 6/2005 |
|----|---------------|--------|
| JP | 2012-134905 A | 7/2012 |
| WO | 2012/108124 A1 | 8/2012 |

OTHER PUBLICATIONS

International Search Report issued in PCT/JP2020/002465; dated Mar. 3, 2020.
(Continued)

*Primary Examiner* — Duc C Ho
(74) *Attorney, Agent, or Firm* — Studebaker & Brackett PC

(57) ABSTRACT

A method with which the reception sensitivity of a communication device can be measured accurately and with satisfactory reproducibility and a method with which the effect of noise control performed upon a communication device can be accurately evaluated. A first communication device in a nonreflective environment in an anechoic chamber wirelessly receives a test signal transmitted from a pseudo base station through an attached antenna thereof at the same time when a second communication device near the first communication device receives the test signal through a signal line. The first communication device is simultaneously subjected to the interference of noise generated by the second communication device at the attached antenna. Thus, the noise is made to interfere with the attached antenna of the first communication device without disassembling the first
(Continued)

communication device and moving the first communication device in the nonreflective environment.

20 Claims, 4 Drawing Sheets

(51) Int. Cl.
*H04B 17/15* (2015.01)
*G01R 29/08* (2006.01)

(56) References Cited

OTHER PUBLICATIONS

Written Opinion of the International Searching Authority issued in PCT/JP2020/002465 dated Mar. 3, 2020.

* cited by examiner

COMMUNICATION DEVICE RECEPTION SENSITIVITY MEASUREMENT METHOD AND COMMUNICATION DEVICE NOISE CONTROL EFFECT EVALUATION METHOD USING THE SAME

CROSS-REFERENCE TO RELATED APPLICATIONS

This application claims benefit of priority to International Patent Application No. PCT/JP2020/002465, filed Jan. 24, 2020, and to Japanese Patent Application No. 2019-035308, filed Feb. 28, 2019, the entire contents of each are incorporated herein by reference.

BACKGROUND

Technical Field

The present disclosure relates to a communication device reception sensitivity measurement method of placing a communication device in a nonreflective environment and measuring the reception sensitivity of the communication device and a communication device noise control effect evaluation method using the communication device reception sensitivity measurement method.

Background Art

Examples of this type of communication device reception sensitivity measurement method in the related art include the MIMO communication device reception sensitivity measurement method disclosed in International Publication No. 2012/108124.

In this reception sensitivity measurement method, a MIMO communication device is placed in an anechoic room. A reception antenna for receiving a test signal is connected to one of two feeding points of the MIMO communication device and a coaxial cable is connected to the other one of them. At the time of measurement of the reception sensitivity of a MIMO communication device, a test signal is transmitted from a transmission antenna to the reception antenna of the MIMO communication device and a test signal is transmitted to the MIMO communication device through the coaxial cable. The measurement of reception sensitivity of the MIMO communication device is performed by measuring the minimum power required for the performance of a predetermined function of the MIMO communication device, for example, power with which a bit error rate is greater than or equal to a predetermined value.

Since one of test signal strings is input to the MIMO communication device in a wireless manner and the other one of them is input to the MIMO communication device in a wired manner with the reception sensitivity measurement method in the related art, the influence of noise generated by the MIMO communication device itself on the reception sensitivity thereof, or so-called the influence of self-poisoning, can be checked. When noise control is performed against self-poisoning, the effect of the noise control can be evaluated by measuring and comparing pre-noise control reception sensitivity and post-noise control reception sensitivity.

SUMMARY

However, in the case of the reception sensitivity measurement method in the related art disclosed in International Publication No. 2012/108124, it is required that, when noise control is performed upon a MIMO communication device, the MIMO communication device be disassembled, noise control be performed inside a housing, and the MIMO communication device be reassembled. At the time of the reassembly, the orientation and position of assembly of a reception antenna to the housing of the MIMO communication device are slightly changed and a pressure at a point of contact between the reception antenna and a circuit board accommodated in the housing is changed. When the reassembled MIMO communication device is placed in an anechoic room, the placement position of the MIMO communication device in the anechoic room is sometimes changed. The antenna characteristics of the MIMO communication device are changed because of such phenomena. Accordingly, with the reception sensitivity measurement method in the related art, variations in measurement values of reception sensitivity of the MIMO communication device occur and the accurate measurement of reception sensitivity cannot be performed.

Since the variations in measurement values of reception sensitivity of the reassembled MIMO communication device occur, the evaluation of an effect of the noise control performed upon the MIMO communication device cannot also be accurately performed.

Accordingly, the present disclosure provides a communication device reception sensitivity measurement method of measuring reception sensitivity of a communication device. The communication device reception sensitivity measurement method includes a placement step of placing a first communication device and a second communication device close to each other in a nonreflective environment in which no radio wave is reflected, with the first communication device having an antenna terminal connected to an attached antenna and being a measurement target of reception sensitivity, and the second communication device having an antenna terminal connected to a signal line instead of an attached antenna and having the same configuration as the first communication device. The method further includes a signal transmission step of wirelessly transmitting a test signal from a pseudo communication station to the attached antenna of the first communication device through a communication antenna placed at a predetermined distance from the first communication device in the environment and transmitting the test signal from a pseudo communication station to the second communication device through the signal line, a noise interference step of operating the second communication device to cause the second communication device to generate noise while the test signal is wirelessly transmitted to the attached antenna of the first communication device and making the generated noise interfere with the attached antenna of the first communication device, a return step of wirelessly transmitting a return signal from the first communication device to a pseudo communication station through the attached antenna and the communication antenna in response to the test signal, and a reception sensitivity measurement step of measuring reception sensitivity of the first communication device based on the return signal.

With this configuration, the first communication device placed in the nonreflective environment wirelessly receives a test signal transmitted from the pseudo base station through the attached antenna thereof at the same time when the second communication device placed near the first communication device receives the test signal through the signal line. The first communication device is simultaneously subjected to not only the reception of the test signal but also the interference of noise generated by the second communication device at the attached antenna. Thus, the noise, which is generated by the second communication device having the same configuration as the first communication device and is the same as the noise generated by the first communication device itself, is made to interfere with the attached antenna of the first communication device, so that a state like self-poisoning can occur.

Accordingly, the second communication device is disassembled instead of the first communication device, noise control is performed upon the second communication device, and then noise generated by the second communication device is made to interference with the attached antenna of the first communication device. The pre-noise control reception sensitivity and post-noise control reception sensitivity of the first communication device can therefore be measured without disassembling the first communication device and moving the first communication device in the nonreflective environment. As a result, the antenna characteristics of the first communication device do not change dislike in the case where a measurement method in the related art is performed, the occurrence of variations in measurement values of reception sensitivity of the first communication device after noise control is suppressed, and the reception sensitivity of a communication device can be measured accurately and with satisfactory reproducibility.

The present disclosure also provides a communication device noise control effect evaluation method including a pre-control reception sensitivity measurement step of measuring pre-noise control reception sensitivity of the first communication device using the above communication device reception sensitivity measurement method, a noise control step of disassembling the second communication device, performing noise control upon a noise source of noise generated by the second communication device in the noise interference step, reassembling the second communication device, and relocating the second communication device in the environment, a post-control reception sensitivity measurement step of measuring post-noise control reception sensitivity of the first communication device using the above communication device reception sensitivity measurement method, and a noise control effect evaluation step of evaluating an effect of the noise control by comparing the measured pre-noise control reception sensitivity and the measured post-noise control reception sensitivity.

With this configuration, the pre-noise control reception sensitivity and post-noise control reception sensitivity of the first communication device can be measured accurately and with satisfactory reproducibility in the pre-control reception sensitivity measurement step and the post-control reception sensitivity measurement step, respectively. Accordingly, the effect of the noise control performed upon the communication device can also be accurately evaluated in the noise control effect evaluation step.

According to the present disclosure, there can be provided a communication device reception sensitivity measurement method with which the reception sensitivity of a communication device can be measured accurately and with satisfactory reproducibility and a communication device noise control effect evaluation method with which the evaluation of an effect of noise control performed upon a communication device can be accurately performed.

DETAILED DESCRIPTION

Next, a communication device reception sensitivity measurement method according to an embodiment of the present disclosure and a communication device noise control effect evaluation method according to an embodiment of the present disclosure will be described.

Figure 1:
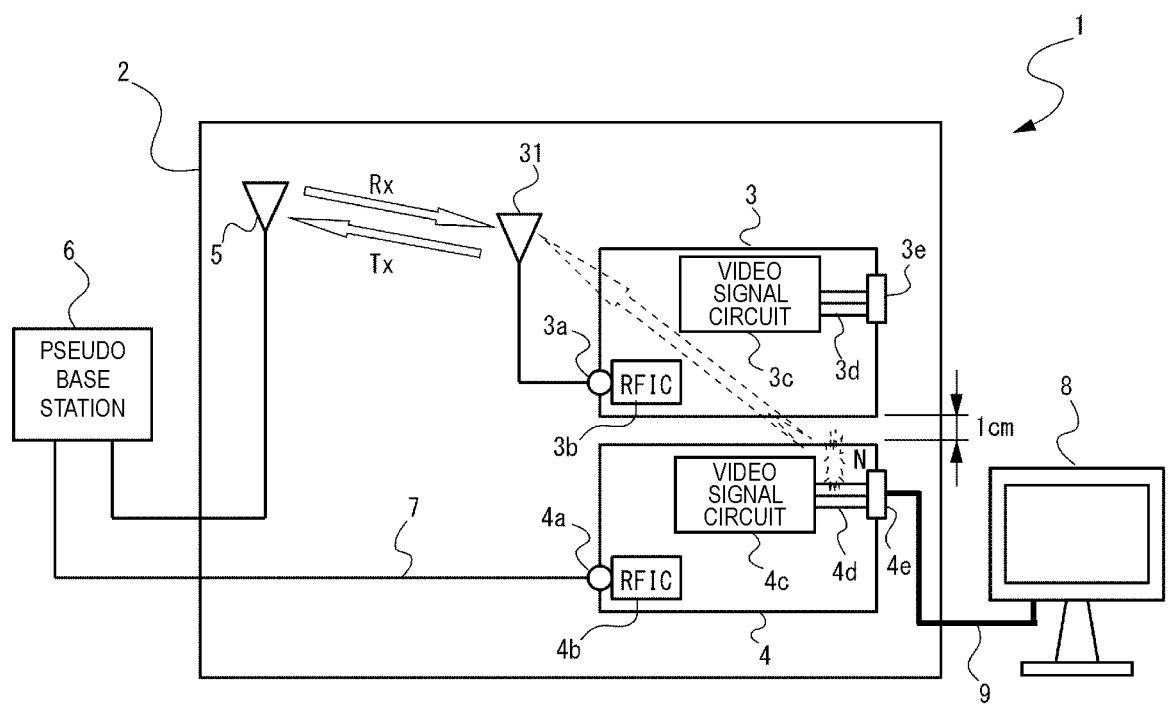
FIG. 1 is a block diagram illustrating the schematic configuration of a measurement system to which a communication device reception sensitivity measurement method according to an embodiment of the present disclosure and a communication device noise control effect evaluation method according to an embodiment of the present disclosure are applied.

FIG. 1 is a block diagram illustrating the schematic configuration of a measurement system 1 to which a communication device reception sensitivity measurement method according to an embodiment of the present disclosure and a communication device noise control effect evaluation method according to an embodiment of the present disclosure are applied.

The measurement system 1 includes a first communication device 3, a second communication device 4, and a communication antenna 5 which are placed in an anechoic chamber 2 and a pseudo base station 6 placed outside the anechoic chamber 2.

The anechoic chamber 2 forms a nonreflective environment in which no radio wave is reflected therein and is cut off from external noise. The first communication device 3 that is a measurement target of reception sensitivity and the second communication device 4 are placed close to each other in this nonreflective environment. The first communication device 3 and the second communication device 4 are of the same model (type) and have the same configuration and the same reception sensitivity. The first communication device 3 and the second communication device 4 are, for example, electronic devices having a communication function, such as Wi-Fi® routers, smartphones, or personal computers (PCs) and have respective independent housings, noise sources, and antenna terminals 3a and 4a, respectively. In this embodiment, an attached antenna 31 attached to the first communication device 3 is connected to the antenna terminal 3a of the first communication device 3. Instead of an attached antenna of the second communication device 4, a signal line 7 is connected to the antenna terminal 4a of the second communication device 4.

Examples of a measurement target of reception sensitivity include a smartwatch, a car navigation device, an electronic game device, a personal digital assistant, an e-book device, an information communications (IC) tag, and a pedometer with a wireless communication function in addition to a Wi-Fi router, a smartphone, and a PC which have been described above. All of electronic devices with a communication function which have respective independent housings, respective noise sources, and respective antenna terminals become measurement targets of reception sensitivity performed with a communication device reception sensitivity measurement method according to this embodiment.

The first communication device 3 wirelessly communicates with an external device using the attached antenna 31 while using an RFIC 3*b* as a communication circuit. In this embodiment, the first communication device 3 wirelessly communicates with the pseudo base station 6 via a nondirectional communication antenna 5 placed at a predetermined distance from the first communication device 3 in the nonreflective environment. The communication antenna 5 may be a directional antenna. The second communication device 4 communicates with the pseudo base station 6 through the signal line 7 in a wired manner while using an RFIC 4*b* as a communication circuit. The pseudo base station 6 is, for example, a pseudo communication station formed of a Wi-Fi communication measurement device and has a function of communicating with the first communication device 3 and the second communication device 4. The pseudo base station 6 transmits a test signal to be described below to the first communication device 3 and the second communication device 4 using this communication function and also has a function of analyzing a return signal to be described below which is transmitted from the first communication device 3 in response to the transmitted test signal.

The first communication device 3 and the second communication device 4 include video signal circuits 3*c* and 4*c* for outputting video to a monitor 8, respectively. The video signal circuit 3*c* is connected to a connector 3*e* through a signal line 3*d*. The video signal circuit 4*c* is connected to a connector 4*e* through a signal line 4*d*. In this embodiment, an HDMI® cable 9 is connected to the connector 4*e*. The video signal circuit 4*c* in the second communication device 4 is connected to the monitor 8 through the HDMI cable 9.

Figure 2:
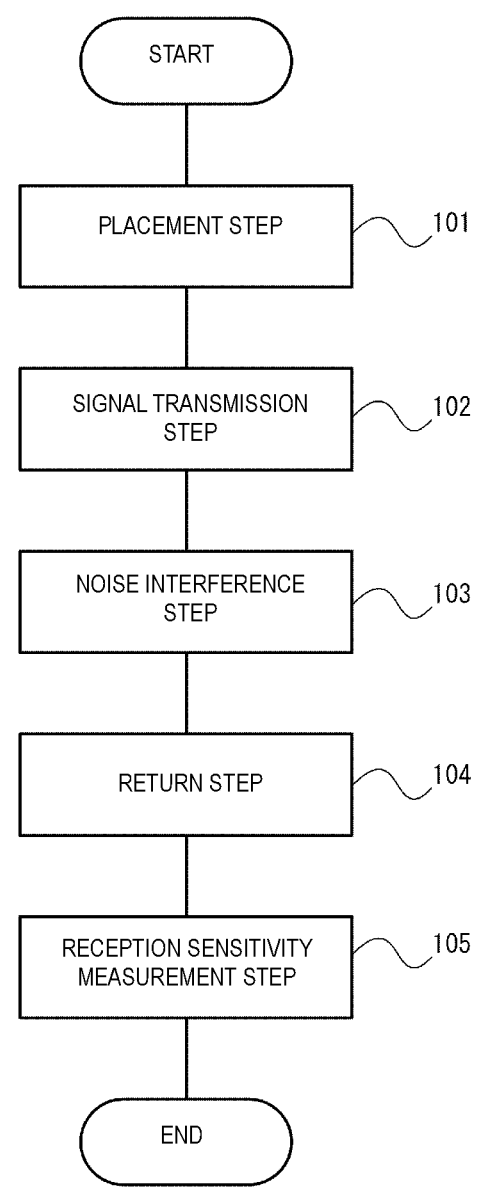
FIG. 2 is a flowchart of a communication device reception sensitivity measurement method according to an embodiment of the present disclosure.

FIG. 2 is a flowchart of a communication device reception sensitivity measurement method according to an embodiment of the present disclosure.

In placement step 101, the first communication device 3 and the second communication device 4 are placed close to each other in a nonreflective environment formed in the anechoic chamber 2. Subsequently, in signal transmission step 102, a test signal Rx is transmitted from the pseudo base station 6 to the attached antenna 31 of the first communication device 3 via the communication antenna 5 in a wireless manner and to the second communication device 4 through the signal line 7 in a wired manner. The test signal Rx is a specific signal having a given number of pieces of data. Although the case is described in this embodiment where the same test signal Rx is transmitted from the same pseudo base station 6 to the first communication device 3 and the second communication device 4, the same test signal Rx may be transmitted from different pseudo base stations to the first communication device 3 and the second communication device 4.

Subsequently, in noise interference step 103, the video signal circuit 4*c* in the second communication device 4 is operated while the test signal Rx is wirelessly transmitted to the attached antenna 31 of the first communication device 3. When the video signal circuit 4*c* is operated, a video signal is output from the video signal circuit 4*c* to the monitor 8 through the signal line 4*d* and the HDMI cable 9 and video is displayed on the monitor 8. At the time of the transmission of the video signal through the signal line 4*d*, noise N (see, FIG. 1) is generated from the signal line 4*d*. The first communication device 3 is set to perform a circuit operation of not generating the noise N, and the second communication device 4 is set to perform the same circuit operation as the first communication device 3 except for the generation of noise. The noise N generated in the second communication device 4 has a frequency band overlapping the frequency band of the test signal Rx, so that the noise N is electromagnetically coupled to the attached antenna 31 of the first communication device 3 placed near the second communication device 4 and made to interferes with the attached antenna 31. Accordingly, the attached antenna 31 of the first communication device 3 is prevented from completely receiving the test signal Rx because of the noise N.

Subsequently, in return step 104, a return signal Tx is wirelessly transmitted from the first communication device 3 to the pseudo base station 6 via the attached antenna 31 and the communication antenna 5 in response to the test signal Rx. The return signal Tx is, for example, a signal indicating how many of the given number of pieces of data in the test signal Rx received from the pseudo base station 6 have been able to be received. In reception sensitivity measurement step 105, the pseudo base station 6 measures the reception sensitivity of the first communication device 3 on the basis of the return signal Tx received from the first communication device 3. As this reception sensitivity, the pair of a quality evaluation index such as a bit error rate or a frame error rate calculated on the basis of the test signal Rx transmitted by the pseudo base station 6 and the return signal Tx received from the first communication device 3 and the signal intensity of the test signal Rx is measured. For example, by measuring the signal intensity of the test signal Rx with which a bit error rate or a frame error rate is greater than or equal to a predetermined value, the reception sensitivity of the first communication device 3 is evaluated.

Figure 3:
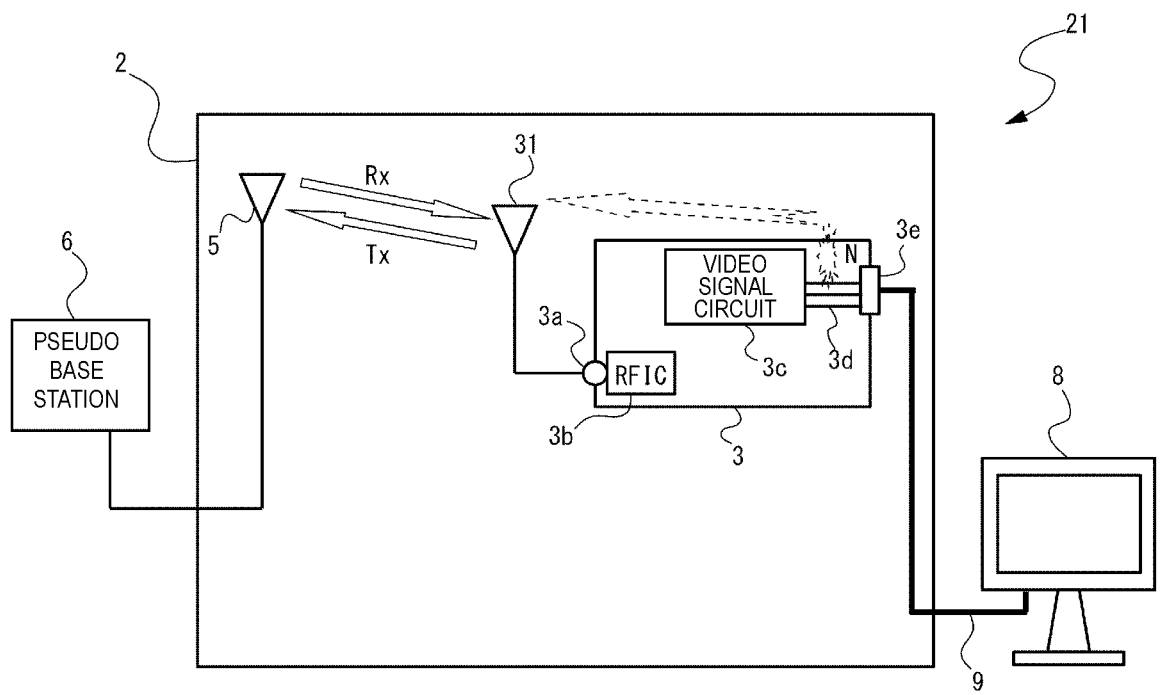
FIG. 3 is a block diagram illustrating the schematic configuration of a measurement system according to a comparative example.

With the communication device reception sensitivity measurement method according to this embodiment, the first communication device 3 placed in the nonreflective environment in the anechoic chamber 2 wirelessly receives the test signal Rx transmitted from the pseudo base station 6 through the attached antenna 31 thereof at the same time when the second communication device 4 placed near the first communication device 3 receives the test signal Rx through the signal line 7 as described above. The first communication device 3 is simultaneously subjected to not only the reception of the test signal Rx but also the interference of the noise N generated by the second communication device 4 at the attached antenna 31. Thus, the noise N, which is generated by the second communication device 4 having the same configuration as the first communication device 3 and is the same as the noise generated by the first communication device 3 itself, is made to interfere with the attached antenna 31 of the first communication device 3. Accordingly, a state like the self-poisoning of a measurement system 21 according to a comparative example illustrated in FIG. 3 which has been used can occur in the measurement system 1. Referring to FIG. 3, the same reference numerals are used to identify parts already described with reference to FIG. 1, and the description thereof will be omitted.

The first communication device 3 illustrated in FIG. 3, which has the connector 3*e* to which the monitor 8 is connected through the HDMI cable 9, outputs a video signal from the video signal circuit 3*c* to the monitor 8 through the signal line 3*d* and the HDMI cable 9. The noise N generated in the signal line 3*d* interferes with the attached antenna 31 of the first communication device 3 itself at the time of reception of the test signal Rx, that is, self-poisoning occurs in the first communication device 3. This state is equivalent to the state where the noise N generated by the second communication device 4 is made to interferes with the attached antenna 31 of the first communication device 3 in the measurement system 1 illustrated in FIG. 1.

Accordingly, when noise control is performed, the second communication device 4 is disassembled instead of the first communication device 3, noise control is performed upon the second communication device 4, and then the noise N generated by the second communication device 4 is made to interference with the attached antenna 31 of the first communication device 3. The pre-noise control reception sensitivity and post-noise control reception sensitivity of the first communication device 3 can therefore be measured without disassembling the first communication device 3 and moving the first communication device 3 in a nonreflective environment. Since the change of the first communication device 3 due to the disassembly and reassembly of the device and the positional change of the first communication device 3 due to the relocation of the device do not occur after noise control, the antenna characteristics of the first communication device 3 do not change dislike in the case where a measurement method according to a comparative example is performed. Accordingly, the occurrence of variations in measurement values of reception sensitivity of the first communication device 3 after noise control is suppressed, and the reception sensitivity of the first communication device 3, that is, the reception sensitivity of a communication device of the same model as the first communication device 3 and the second communication device 4 can be measured accurately and with satisfactory reproducibility after noise control.

To determine the effect of a communication device reception sensitivity measurement method according to this embodiment, the experiment of the comparison with a reception sensitivity measurement method according to a comparative example was performed. This comparative experiment was performed by causing the measurement system 1 in FIG. 1 to measure the reception sensitivity of the first communication device 3 according to this embodiment ten times using the process in FIG. 2, causing the measurement system 21 in FIG. 3 to measure the reception sensitivity of the first communication device 3 ten times using a measurement method according to a comparative example, and comparing the measurement values of the reception sensitivities. As the first communication device 3 and the second communication device 4, stick PCs of the same model were used. When the HDMI connection between the monitor 8 and a stick PC is established, the stick PC sometimes emits noise affecting wireless communication at the time of HDMI communication.

In the measurement system 1 in FIG. 1, the first communication device 3 and the second communication device 4 were closely placed side by side at a distance of 1 cm from each other. The first communication device 3 was not disassembled and moved, and the second communication device 4 was disassembled, reassembled, and relocated in the anechoic chamber 2 each time measurement was performed. The wireless communication between the pseudo base station 6 and the first communication device 3 was performed in accordance with IEEE802.11ac that was a high-speed Wi-Fi LAN standard provided by the Institute of Electrical and Electronics Engineers (IEEE). The first communication device 3 was not connected to the monitor 8, the connection between the second communication device 4 and the monitor 8 was established in accordance with the HDMI1.4 standard such that the noise N was generated, and the length of the HDMI cable 9 was set to 2 m.

The following table 1 indicates the result of measurement of reception sensitivity of the first communication device 3 performed in the measurement system 1 set as above using the above-described measurement method.

TABLE 1

| | 1 | 2 | 3 | 4 | 5 | 6 | 7 | 8 | 9 | 10 | Average |
|---|---|---|---|---|---|---|---|---|---|---|---|
| Reception Sensitivity (dBm) | −74.4 | −74.4 | −74.6 | −74.4 | −74.2 | −74.4 | −74.4 | −74.4 | −74.4 | −74.4 | −74.40 |
| Deviation from Average (%) | 0.0 | 0.0 | 0.3 | 0.0 | −0.3 | 0.0 | 0.0 | 0.0 | 0.0 | 0.0 | |

The above table 1 indicates the respective measurement values of reception sensitivity (dBm) obtained in the 10-time measurement and deviations of the respective measurement values from an average of the measurement values obtained in the 10-time measurement by percentage (%). Reception sensitivity (dBm) is the signal intensity of the test signal Rx at which a bit error rate calculated in the reception sensitivity measurement step 105 is greater than or equal to a predetermined value.

In the measurement system 21 illustrated in FIG. 3, the attached antenna 31 of the first communication device 3 was caused to receive the test signal Rx wirelessly transmitted from the pseudo base station 6 and the video signal circuit 3c was caused to output a video signal to the signal line 3d for the display of video on the monitor 8. The transmission of a video signal through the signal line 3d generates the noise N in the signal line 3d, and the overlap between the frequency band of the noise N and the frequency band of the test signal Rx causes the interference of the noise N with the attached antenna 31. Upon receiving the test signal Rx partly broken by the noise N, the first communication device 3 was caused to transmit the return signal Tx to the pseudo base station 6 via the attached antenna 31 and the communication antenna 5 like the above measurement system 1. The pseudo base station 6 was caused to measure the reception sensitivity of the first communication device 3 on the basis of the transmitted test signal Rx and the received return signal Tx like the measurement system 1. Each time measurement was performed, the first communication device 3 was disassembled, reassemble, and relocated in the anechoic chamber 2.

In the measurement system 21 according to a comparative example illustrated in FIG. 3, the wireless communication between the pseudo base station 6 and the first communication device 3 was performed in accordance with IEEE802.11ac that was a high-speed wireless LAN standard, the connection between the first communication device 3 and the monitor 8 was established in accordance with the HDMI1.4 standard, and the length of the HDMI cable 9 was set to 2 m like in the measurement system 1. The following table 2 indicates the result of measurement of reception sensitivity of the first communication device 3 performed in the measurement system 21 set as above.

TABLE 2

|  | 1 | 2 | 3 | 4 | 5 | 6 | 7 | 8 | 9 | 10 | Average |
|---|---|---|---|---|---|---|---|---|---|---|---|
| Reception Sensitivity (dBm) | −73.4 | −76 | −73.8 | −72.4 | −74.4 | −71.2 | −74.4 | −70.4 | −72.4 | −74.2 | −73.26 |
| Deviation from Average (%) | 0.2 | 3.7 | 0.7 | −1.2 | 1.6 | −2.8 | 1.6 | −3.9 | −1.2 | 1.3 | |

The above table 2 also indicates the respective measurement values of reception sensitivity (dBm) obtained in the 10-time measurement and deviations of the respective measurement values from an average of the measurement values obtained in the 10-time measurement by percentage (%) like Table 1.

Table 1 indicates that the maximum deviation from the average in the 10-time measurement performed with a reception sensitivity measurement method according to this embodiment is 0.3%. Table 2 indicates that the maximum deviation from the average in the 10-time measurement performed with a reception sensitivity measurement method according to a comparative example is 3.9%.

Figure 4:
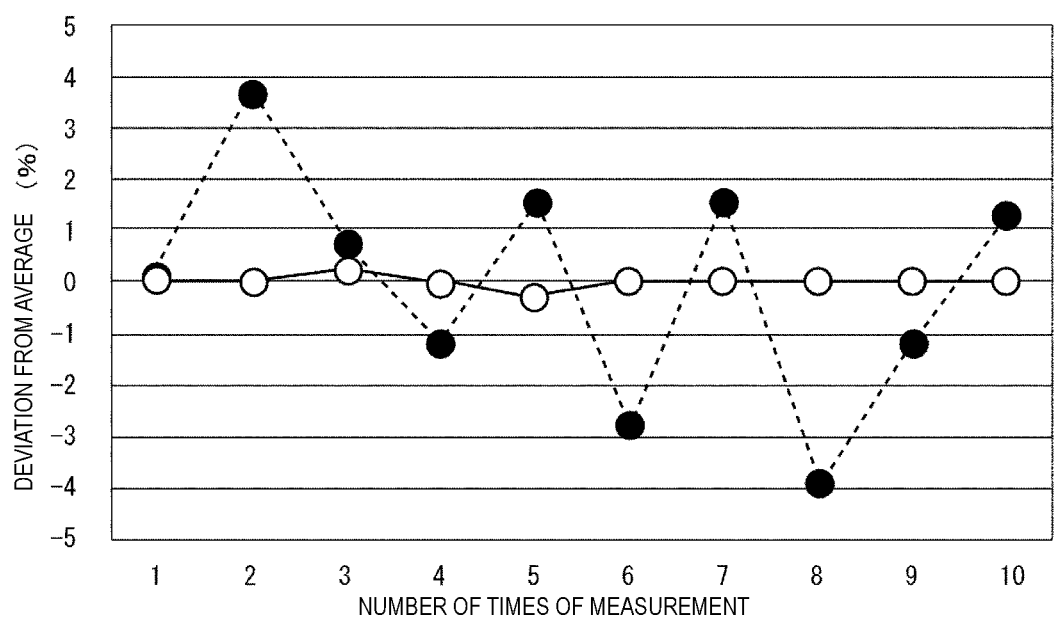
FIG. 4 is a graph representing respective variations in reception sensitivity measured with a communication device reception sensitivity measurement method according to an embodiment of the present disclosure and a reception sensitivity measurement method according to a comparative example.

FIG. 4 is a graph illustrating the above result of the comparative experiment. In the graph, the horizontal axis represents the number of times of measurement of reception sensitivity and the vertical axis represents a deviation (%) from an average of measurement values of reception sensitivity. White circles are plots of respective deviation values in Table 1 and black circles are plots of respective deviation values in Table 2. It is apparent from the graph that the deviation obtained with the reception sensitivity measurement method according to a comparative example significantly varies as represented by the black circles and, in contrast, the deviation obtained with the reception sensitivity measurement method according to this embodiment slightly varies as represented by the white circles. Accordingly, it was confirmed from this comparative experiment that the occurrence of variations in measurement values of reception sensitivity was suppressed and reception sensitivity could be measured accurately and with satisfactory reproducibility with the reception sensitivity measurement method according to this embodiment as compared with the case where the reception sensitivity measurement method according to a comparative example was used.

Although the video signal circuit 4c in the second communication device 4 is operated to generate the noise N to be made to interfere with the attached antenna 31 of the first communication device 3 in the noise interference step 103 in the above embodiment, the noise source of the noise N is not limited thereto. For example, the noise N to be made to interfere with the attached antenna 31 of the first communication device 3 may be generated by causing an audio signal circuit (not illustrated) in the second communication device 4 to operate to output sound from a speaker in the second communication device 4 in the noise interference step 103. In this case, the noise N to be made to interfere with the attached antenna 31 is generated in a signal line for outputting an audio signal from the audio signal circuit to the speaker. Alternatively, the noise N to be made to interfere with the attached antenna 31 of the first communication device 3 may be generated by activating a communication circuit such as the RFIC 4b in the second communication device 4 in the noise interference step 103. When the first communication device 3 and the second communication device 4 include camera modules, the noise N to be made to interfere with the attached antenna 31 of the first communication device 3 may be generated by activating the camera module in the second communication device 4. Other objects that generate noise in the band of wireless communication between the communication antenna 5 and the attached antenna 31 also correspond to noise sources.

For example, switching noise in a power supply circuit for a DC/DC converter or the like, noise generated by a transmission signal, such as a differential transmission signal or a single-ended transmission signal, noise generated at the time of coupling of a wireless signal with a signal line, noise due to wiring pattern design, noise generated when a signal transmits through wiring lines having different lengths or wiring lines having different potential balances because of characteristics impedance mismatching, and noise generated when the wiring pattern of the ground (GND) or a power supply forms a floating island or the different wiring patterns of, for example, a signal line and a power supply line in the upper and lower layers of a circuit board cross correspond to noise sources. These noise sources are also not caused to generate noise in the first communication device 3 but in the second communication device 4.

Although a nonreflective environment is formed in the anechoic chamber 2 in the above embodiment, a nonreflective environment does not necessarily have to be formed in the anechoic chamber 2 and may be formed in an anechoic room or a TEM (transverse electromagnetic) cell in which an electric field can be kept constant.

Although the wireless communication between the pseudo base station 6 and the first communication device 3 is Wi-Fi communication in the above embodiment, it is not limited to Wi-Fi communication and may be, for example, Cellular®-type wireless communication.

Figure 5:
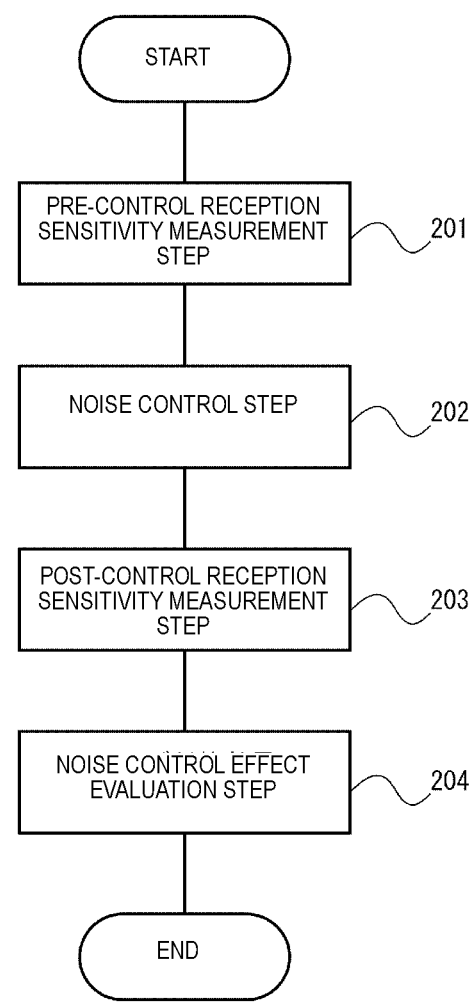
FIG. 5 is a flowchart of a communication device noise control effect evaluation method according to an embodiment of the present disclosure.

FIG. 5 is a flowchart of a communication device noise control effect evaluation method according to an embodiment of the present disclosure. For this communication device noise control effect evaluation method, the above communication device reception sensitivity measurement method and the measurement system 1 illustrated in FIG. 1 are used.

First, in pre-control reception sensitivity measurement step 201 in a communication device noise control effect evaluation method, the pre-noise control reception sensitivity of the first communication device 3 is measured using the communication device reception sensitivity measurement method in FIG. 2. Subsequently, in noise control step 202, the second communication device 4 is disassembled, noise control is performed upon a noise source of noise generated by the second communication device 4 in the noise interference step 103 (see FIG. 2), and the second communication device 4 is reassembled. In this noise control, a noise source is searched for and determined in a circuit board in the disassembled second communication device 4. When a noise source is determined, noise control for suppressing the generation of noise is performed by placing a noise filter (e.g., a ferrite bead, a common-mode choke, a normal-mode choke, a choke inductor, an isolation inductor, a capacitor, a three-terminal capacitor, or an LC filter) in a circuit in the noise source or blunting the rising waveform of a signal output from the noise source such as a DC-DC converter. Noise control is also performed by covering an IC or a circuit in the noise source with a metal shield or a radio wave absorption sheet, so that noise is enclosed or the noise source is protected from exogenous noise.

Subsequently, the second communication device 4 that has been subjected to noise control and reassembled is relocated in the anechoic chamber 2. In post-control reception sensitivity measurement step 203, the post-noise control reception sensitivity of the first communication device 3 is measured again using the communication device reception sensitivity measurement method in FIG. 2. Subsequently, in noise control effect evaluation step 204, the effect of the noise control is evaluated by comparing the pre-noise control reception sensitivity and post-noise control reception sensitivity of the first communication device 3.

With a communication device noise control effect evaluation method according to this embodiment, the pre-noise control reception sensitivity and post-noise control reception sensitivity of the first communication device 3 can be measured accurately and with satisfactory reproducibility in the pre-control reception sensitivity measurement step 201 and the post-control reception sensitivity measurement 203, respectively. Accordingly, the evaluation of the effect of the noise control performed upon the second communication device 4 in the noise control effect evaluation step 204, that is, the evaluation of an effect of noise control performed upon a communication device of the same model as the first communication device 3 and the second communication device 4, can also be accurately performed. By considering a noise control method for the second communication device 4, a noise control method for the first communication device 3 can be considered without disassembling the first communication device 3. Noise control can therefore be performed upon a communication device of the same model as the first communication device 3 and the second communication device 4 while reproducibility is maintained.

In a communication device noise control effect evaluation method according to this embodiment, a noise filter was inserted in a noise source to perform noise control upon the noise source. In the pre-control reception sensitivity measurement step 201 and the post-control reception sensitivity measurement 203, the measurement of reception sensitivity was performed under the same conditions as those when the measurement of reception sensitivity was performed ten times using the above communication device reception sensitivity measurement method. Consequently, the measurement values of the pre-noise control reception sensitivity and post-noise control reception sensitivity of the first communication device 3 were obtained as represented by table 3.

TABLE 1

| | |
|---|---|
| Reception Sensitivity with No Control (dBm) | −70.4 |
| Reception Sensitivity with Control (dBm) | −72.6 |
| Improvement Effect by Control (dB) | 2.2 |

As represented by table 3, the pre-noise control reception sensitivity of the first communication device 3 was −70.4 (dBm) and was improved to −72.6 (dBm) after noise control. The improvement effect of the noise control in the noise control step 202 was 2.2 (dB) as represented by table 3. If the pre-control reception sensitivity measurement step 201 and the post-control reception sensitivity measurement 203 are performed using a communication device reception sensitivity measurement method according to a comparative example, it is difficult to determine whether this noise control improvement effect of 2.2 (dB) is a variation in measurement value or a noise control improvement effect because the noise control improvement effect falls within the measurement value variation range of up to 3.9% as represented by table 2. However, when the pre-control reception sensitivity measurement step 201 and the post-control reception sensitivity measurement 203 are performed using a communication device reception sensitivity measurement method according to this embodiment illustrated in FIG. 2, it can be easily determined that this is a noise control improvement effect because the measurement value variation range is up to 0.3% as represented by Table 1.

What is claimed is:

1. A communication device reception sensitivity measurement method of measuring reception sensitivity of a communication device, comprising:
   placing a first communication device and a second communication device close to each other in a nonreflective environment in which no radio wave is reflected, the first communication device having an antenna terminal connected to an attached antenna and being a measurement target of reception sensitivity, and the second communication device having an antenna terminal connected to a signal line instead of an attached antenna and having the same configuration as the first communication device;
   wirelessly transmitting a test signal from a pseudo communication station to the attached antenna of the first communication device through a communication antenna placed at a predetermined distance from the first communication device in the environment and transmitting the test signal from a pseudo communication station to the second communication device through the signal line;
   creating noise interference by operating the second communication device to cause the second communication device to generate noise while the test signal is wirelessly transmitted to the attached antenna of the first communication device and making the generated noise interfere with the attached antenna of the first communication device;
   wirelessly transmitting a return signal from the first communication device to the pseudo communication station through the attached antenna and the communication antenna in response to the test signal; and
   measuring reception sensitivity of the first communication device based on the return signal.

2. The communication device reception sensitivity measurement method according to claim 1, wherein
   in the creating noise interference, a video signal circuit included in the second communication device is operated to generate noise to be made to interfere with the attached antenna of the first communication device.

3. The communication device reception sensitivity measurement method according to claim 1, wherein
   in the creating noise interference, an audio signal circuit included in the second communication device is operated to generate noise to be made to interfere with the attached antenna of the first communication device.

4. The communication device reception sensitivity measurement method according to claim 1, wherein in the creating noise interference, a communication circuit included in the second communication device is operated to generate noise to be made to interfere with the attached antenna of the first communication device.

5. A communication device noise control effect evaluation method comprising:
measuring pre-noise control reception sensitivity of the first communication device using the communication device reception sensitivity measurement method according to claim 1;
executing noise control by disassembling the second communication device, performing noise control upon a noise source of noise generated by the second communication device in the creating noise interference, reassembling the second communication device, and relocating the second communication device in the environment;
measuring post-noise control reception sensitivity of the first communication device using the communication device reception sensitivity measurement method; and
evaluating an effect of the noise control by comparing the measured pre-noise control reception sensitivity and the measured post-noise control reception sensitivity.

6. The communication device noise control effect evaluation method according to claim 5, wherein
in the executing noise control, the noise control is performed by providing a noise filter with the noise source.

7. The communication device noise control effect evaluation method according to claim 6, wherein
in the executing noise control, the noise control is performed by covering the noise source with a metal shield.

8. The communication device noise control effect evaluation method according to claim 6, wherein
in the executing noise control, the noise control is performed by covering the noise source with a radio wave absorption sheet.

9. The communication device noise control effect evaluation method according to claim 5, wherein
in the executing noise control, the noise control is performed by covering the noise source with a metal shield.

10. The communication device noise control effect evaluation method according to claim 5, wherein
in the executing noise control, the noise control is performed by covering the noise source with a radio wave absorption sheet.

11. A communication device noise control effect evaluation method comprising:
measuring pre-noise control reception sensitivity of the first communication device using the communication device reception sensitivity measurement method according to claim 2;
executing noise control by disassembling the second communication device, performing noise control upon a noise source of noise generated by the second communication device in the creating noise interference, reassembling the second communication device, and relocating the second communication device in the environment;
measuring post-noise control reception sensitivity of the first communication device using the communication device reception sensitivity measurement method; and
evaluating an effect of the noise control by comparing the measured pre-noise control reception sensitivity and the measured post-noise control reception sensitivity.

12. The communication device noise control effect evaluation method according to claim 11, wherein
in the executing noise control, the noise control is performed by providing a noise filter with the noise source.

13. The communication device noise control effect evaluation method according to claim 12, wherein
in the executing noise control, the noise control is performed by covering the noise source with a metal shield.

14. The communication device noise control effect evaluation method according to claim 12, wherein
in the executing noise control, the noise control is performed by covering the noise source with a radio wave absorption sheet.

15. A communication device noise control effect evaluation method comprising:
measuring pre-noise control reception sensitivity of the first communication device using the communication device reception sensitivity measurement method according to claim 3;
executing noise control by disassembling the second communication device, performing noise control upon a noise source of noise generated by the second communication device in the creating noise interference, reassembling the second communication device, and relocating the second communication device in the environment;
measuring post-noise control reception sensitivity of the first communication device using the communication device reception sensitivity measurement method; and
evaluating an effect of the noise control by comparing the measured pre-noise control reception sensitivity and the measured post-noise control reception sensitivity.

16. The communication device noise control effect evaluation method according to claim 15, wherein
in the executing noise control, the noise control is performed by providing a noise filter with the noise source.

17. The communication device noise control effect evaluation method according to claim 16, wherein
in the executing noise control, the noise control is performed by covering the noise source with a metal shield.

18. The communication device noise control effect evaluation method according to claim 16, wherein
in the executing noise control, the noise control is performed by covering the noise source with a radio wave absorption sheet.

19. A communication device noise control effect evaluation method comprising:
measuring pre-noise control reception sensitivity of the first communication device using the communication device reception sensitivity measurement method according to claim 4;
executing noise control by disassembling the second communication device, performing noise control upon a noise source of noise generated by the second communication device in the creating noise interference, reassembling the second communication device, and relocating the second communication device in the environment;
measuring post-noise control reception sensitivity of the first communication device using the communication device reception sensitivity measurement method; and
evaluating an effect of the noise control by comparing the measured pre-noise control reception sensitivity and the measured post-noise control reception sensitivity.

20. The communication device noise control effect evaluation method according to claim 19, wherein
in the executing noise control, the noise control is performed by providing a noise filter with the noise source.

* * * * *